United States Patent [19]

Trett et al.

[11] Patent Number: 4,839,605

[45] Date of Patent: Jun. 13, 1989

[54] SIGNAL COMPENSATION CIRCUITS

[75] Inventors: John Trett, Marlow; Peter F. Bradbeer, Slough, both of United Kingdom

[73] Assignee: Formula Systems Limited, Eynsham, United Kingdom

[21] Appl. No.: 116,719

[22] PCT Filed: Feb. 4, 1987

[86] PCT No.: PCT/GB87/00080

§ 371 Date: Sep. 25, 1987

§ 102(e) Date: Sep. 25, 1987

[87] PCT Pub. No.: WO87/04691

PCT Pub. Date: Aug. 13, 1987

[30] Foreign Application Priority Data

Feb. 6, 1986 [GB] United Kingdom ............... 8602961

[51] Int. Cl.$^4$ .................. G06G 7/14; H03K 5/13; G08B 21/00; G01C 25/00
[52] U.S. Cl. .................. 328/146; 307/355; 307/358; 307/362; 307/602; 307/603; 307/606; 340/661; 364/571.01
[58] Field of Search .............. 364/571; 328/146, 147, 328/148, 149; 307/355, 356, 357, 358, 362, 363, 364, 602, 603, 606; 340/527, 528, 663, 662, 661

[56] References Cited

U.S. PATENT DOCUMENTS

| | | | |
|---|---|---|---|
| 3,214,700 | 10/1965 | Hook | 340/661 |
| 3,463,939 | 8/1969 | Sturman | 328/148 |
| 4,017,742 | 4/1977 | James | 307/357 |
| 4,349,858 | 9/1982 | Torenius et al. | 361/203 |

Primary Examiner—Stanley D. Miller
Assistant Examiner—Trong Quang Phan
Attorney, Agent, or Firm—Christie, Parker & Hale

[57] ABSTRACT

A detection system for a sliding lift or elevator door comprises at least two sensors for monitoring the door opening. The sensors are arranged to detect the presence of a moving irregular shape (e.g. human form) in the doorway to reverse the opening action of the door or, if already open, to prevent the door from closing. A signal compensation circuit is provided to process the output signals from the sensors in a sense to maintain the outputs equal under steady state conditions. This is achieved by using the output of a first sensor as a reference signal. A comparator compares the output of a second sensor with a reference signal and through a feedback loop modifies the output of the said second sensor in a sense to equal the output of the first sensor. The feedback loop contains a delay circuit which is switchable between a long and a short delay. For slow changes in the output of the second sensor the long delay is effective but for first changes the delay circuit is switched to provide a short delay. The compensation circuit is effectively desensitized against errors due to drift and other slowly varying influences.

12 Claims, 2 Drawing Sheets

SIGNAL COMPENSATION CIRCUITS

The present invention relates to signal compensation circuits for example for compensating the output signals from detection devices and in particular for compensating the output from door detection devices in lift or elevator doors.

In a previously proposed system in its simplest form a pair of sensors are mounted in spaced apart relationship along the leading edge of a sliding door. The output of the sensors is monitored and when a difference in levels of the two outputs is detected, this indicates an irregular shaped obstruction (for example the human form) in the doorway. The system is intended to operate on the principle that the sensors which are mounted on the leading edge of the door, monitor the door space as the door closes. When the sensors sense the presence of the slam post as the door closes the sensors respond equally and so that there is no difference in the level of the two output signals produced. When the human form moves into the door space the shape is irregular and so the two sensors respond differently producing output signals having different levels. A control circuit can be used to respond to this difference to retract the door as a safety measure.

With such systems the operation is never ideal and the two sensors may produce different output levels even when no human form intervenes into the doorway. For example, the slam post may not be parallel to the sensors and dust may gather on one of the sensors and not the other. One sensors may have components which prematurely age.

In order to avoid responding to such differences, it has been proposed to compare the difference between the two outputs at different times during the closure of the door in order to distinguish between variations produced by static components such as a non-parallel door post and variations produced by moving objects such as the human form. An appropriate control signal is then produced by comparing an actual difference signal with a delayed different signal.

According to the present invention there is provided an error compensation system comprising an input and an output terminal interconnected by a signal modifying circuit having a control input, comparison means connected to the output terminal to compare the signal at the output terminal with a reference signal to produce an error signal, first and second delay circuits having substantially different time constants and each connectable to delay and feed the error signal to the control input of the signal modifying circuit, and switch means operable in response to a predetermined condition to cause a selected one of the delay circuits to feed the error signal to said control input.

According to the present invention there is further provided an error compensation system comprising first and second terminals, a comparator having two inputs respectively connected to the first and second terminals and having an output, an integrator comprising resistance means and capacitance means connected to the output of the comparator, control means responsive to a predetermined condition to alter the value of at least one of said resistance and capacitance means to change the time constant of the integrating means, and modifying means for receiving an input signal and supplying it to the first terminal, the modifying means being responsive to the output of the integrator to modify the input signal in a sense to maintain the signal at the first terminal substantially constant.

According to the present invention there is yet further provided a signal compensation system comprising first and second sensors each providing an output in response to a monitored condition, means responsive to the output of the first sensor to provide a quasi reference signal, a comparator for comparing the output of the second sensor with the quasi reference signal to produce an error signal, feedback means responsive to the error signal to modify the output of the second sensor in a sense to equalise it with the quasi reference signal, a first time delay circuit having a first time constant connected to delay the error signal in the feedback circuit, a second delay circuit having a second time constant less than that of the first time constant actuable to delay the error signal in the feedback circuit to a lesser extent, and trigger means responsive to a predetermined condition, to actuate said second delay circuit.

An error correction system embodying the invention will now be described by way of example with reference to the accompanying diagrammatic drawings in which.

Figure 1:
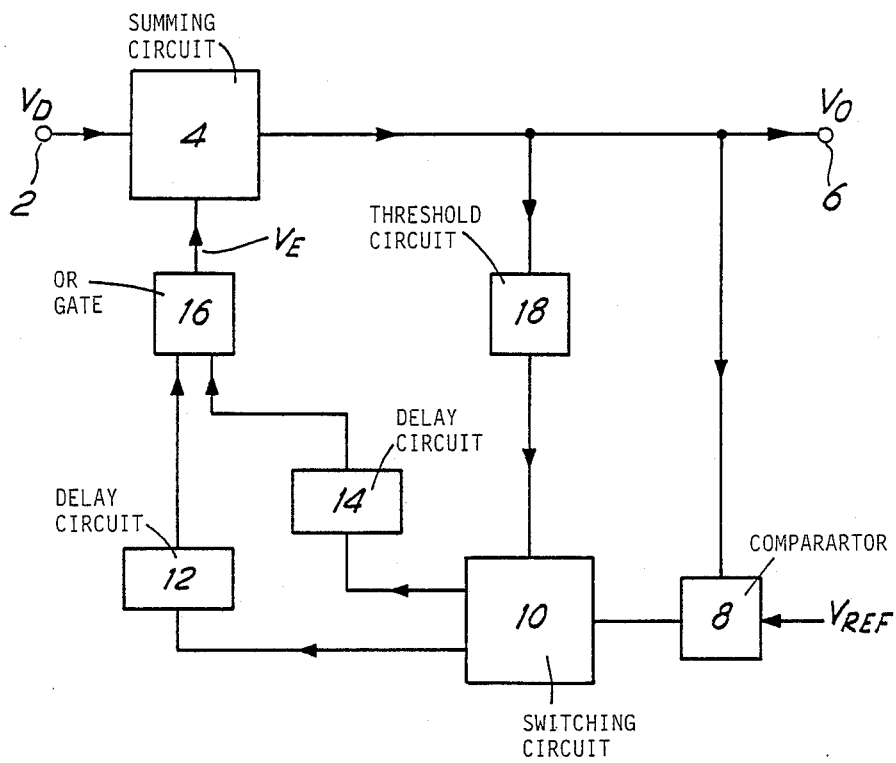
FIG. 1 is a block diagram of the system.

The error signal correction system shown in FIG. 1 includes an input terminal 2 for receiving the output signal $V_D$ of a sensor (not shown) monitoring a predetermined condition. The circuit to be described is arranged to adjust the level of the sensor signal $V_D$ to a level determined by a reference signal $V_{REF}$ so that the error signal is continuously corrected for variations The correction system includes a summing circuit 4 for receiving the signal $V_D$ from the input terminal 2 and a correction signal $V_E$ from a feedback loop which adjusts the value of the signal $V_D$ accordingly before directing it to an output terminal 6 has a signal $V_O$.

A comparator 8 compares the signal $V_O$ at the output terminal 6 with a reference signal $V_{REF}$ (which may be either a fixed or variable signal) and produces an error signal which is fed to a switching circuit 10. The switching circuit 10 is switchable to direct the error signal to one or other of two delay circuits 12 and 14 having substantially different time constants, and the outputs of the delay circuits 12 and 14 are fed via an OR gate 16 to a control input of the summing circuit 4.

A threshold circuit 18 monitors the voltage $V_O$ and when a predetermined threshold is exceeded for a predetermined period of time it will cause the switching circuit 10 to switch from feeding the delay circuit 12 with the longer time constant to the delay circuit 14 with the shorter time constant. Equally when $V_O$ again drops below the threshold level it will switch back again.

In operation relatively slow variations in the sensor output signal $V_D$ are detected by the comparator 8 and an error signal is produced which is fed through the delay circuit 12 (with the longer time constant) to correct the signal $V_D$ in the summing circuit. Thus, for slow variations in $V_D$ even though they are progressive, the output signal $V_O$ will remain substantially unchanged.

When a fast variation in the signal $V_D$ occurs, the delay provided by the delay circuit 12 will not allow the change in error signal $V_E$ to reach the summing circuit 4 in time and the output signal $V_O$ will change. When this change exceeds a threshold level and lasts for the predetermined period of time as determined by the threshold circuit 18, the switching circuit will switch the output of the comparator 8 to the shorter time constant delay circuit 14, thus effectively speeding up the effect of the error correction signal. As soon as the detection signal $V_D$ falls below the threshold level of the threshold circuit 18 the switching circuit 10 will redirect the error signal via the delay circuit 12 having the longer time constant.

With this arrangement it will be appreciated that the detection signal is normally desensitised against errors due to drift and other slow varying influences and that when a fast varying change occurs which subsists for a predetermined period of time the system will attempt to draw the signal $V_D$ back to its previous level at a much faster pace (if $V_{REF}$ remains unchanged) and as soon as this is achieved the slow rate of error correction action is again brought into play.

It will be appreciated that while the switching circuit 10 switches in response to the threshold circuit 18, it can be made to switch in response to some other predetermined condition instead.

Figure 2:
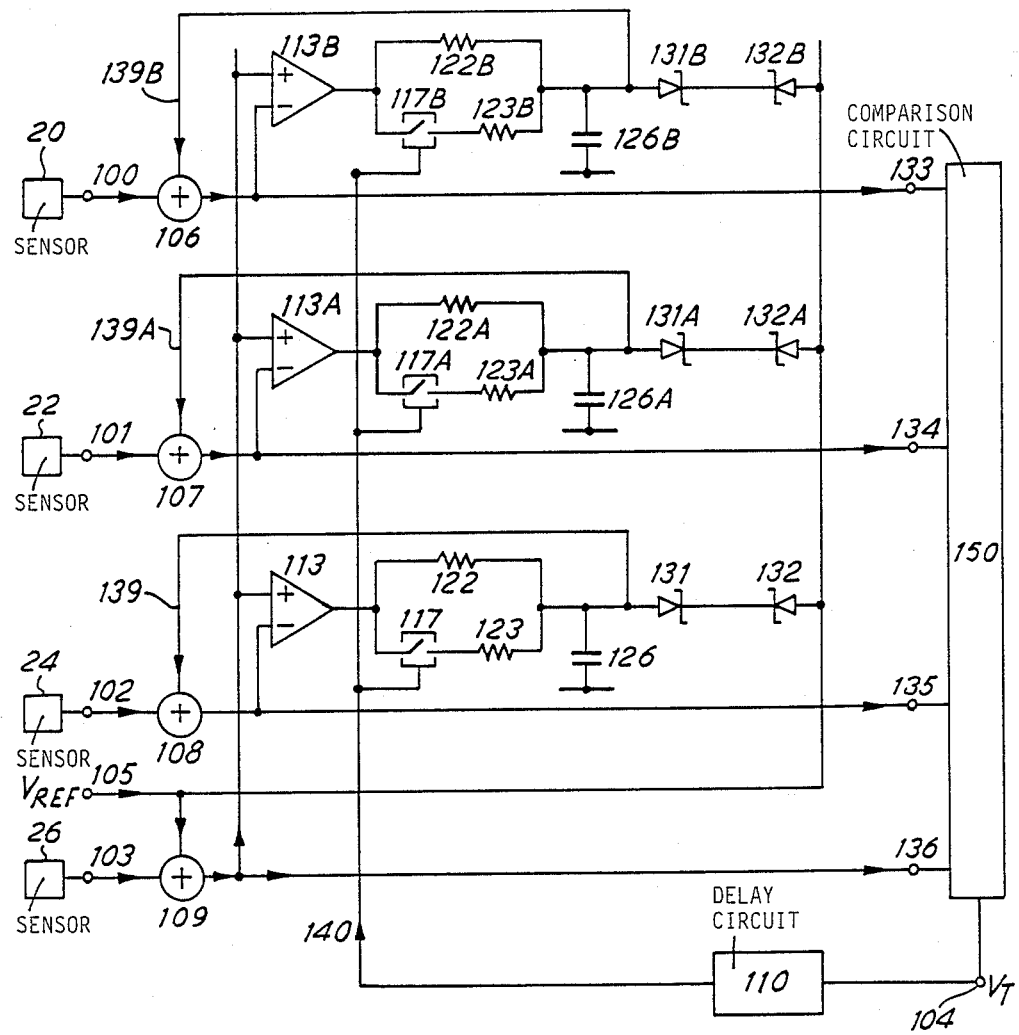
FIG. 2 is a circuit diagram of the system applied to a lift door detection circuit.

FIG. 2 shows an embodiment incorporating the principles of FIG. 1. As shown, four sensors 20, 22, 24 and 26 are mounted in vertically spaced relationship along the leading edge of the sliding door (not shown) of a lift or elevator. Each sensor monitors the space locally between the leading edge of the door and the slam post (not shown) against which the door will eventually close.

A number of arrangements of such sensors are disclosed in our co-pending UK patent application No. 8527277 filed on 6 Nov. 1985.

The four sensors 20 to 26 are coupled to respective input terminals 100 to 103. The four input terminals 100 to 103 are coupled to respective ones of four output terminals 133 to 136 via a corresponding one of four summing circuits 106 to 109.

An input terminal 105 is provided to receive a reference signal $V_{REF}$ and an input terminal 104 is provided to receive a trigger signal $V_T$.

The summing circuit 109 has one input connected to the input terminal 103 and its other input connected to the reference voltage input terminal 105. In this way the output of the summing circuit 109 will generally always be offset from the reference voltage $V_{REF}$.

Each of the three summing circuits 106, 107 and 108 has an associated feedback loop. Only the feedback loop associated with the summing circuit 108 will now be described, but it will be appreciated that in the other two feedback loops, similar components will be given similar references (but with the suffix A and B respectively) and that their function and operation are similar to that of the feedback loop associated with the summing circuit 108.

As shown, the feedback loop comprises a comparator 113 connected to compare the outputs from the two summing circuits 108 and 109. The output of the comparator 113 feeds all RC time delay circuit in the form of an integrator comprising a first resistor 122 and a capacitor 126 connected in series. A second resistor 123 having a substantially lower value than the first resistor is connectable in parallel with the first resistor through a switch 117. The junction between the resistor 122 and capacitor 126 is coupled via a line 139 to the second input of the summing circuit 108.

A pair of zener diodes 131 and 132 are connected in series opposition between the reference terminal 105 and the line 139 to clamp the signal on line 139 to a predetermined level when the signal on line 139 reaches a level which exceeds the reference voltage level by a predetermined amount.

The four output terminals 133 to 136 are coupled to a comparison circuit 150 which will respond to one of the outputs being significantly different to the others to generate a trigger signal $V_T$ which is then fed to input terminal 104.

The comparison circuit 150 may advantageously take the form shown in our co-pending UK patent application No. 8527277.

The output of the input terminal 104 is fed via an asymmetrical delay circuit 110 to control the operation of the switch 117.

In operation under steady state conditions each feedback loop will correct the output signals from respective ones of the output terminals 133 to 135 to equalise them with the level of the output signal from output terminal 136. Thus the outputs from all four output terminals will all be at the same level.

Thus, whatever the individual setting of the individual sensor, their outputs from the four output terminals will, after a settling period following energisation, all be the same.

Thus, even if dust settles on the surfaces of individual sensors or if selected components age prematurely, or if they react differently to changes in ambient conditions, they will still be brought to equal levels. Also if each sensor produces a significant change in output signal, then provided the differences between all four sensor outputs vary relatively slowly the signals at all four outputs will remain equal.

If now one sensor (for example 24) produces a rapid change in output which is different to that produced by the other sensors (20, 22 and 26) then initially the output signal from output terminal 135 will be significantly different from the output at the other terminals. This difference will be detected by the comparison circuit 150 which will generate a trigger signal $V_T$ which is of sustained for a sufficient period (typically 10 seconds) as determined by the delay circuit 110 will cause the switches 117, 117A and 117B to close.

This action allows the feedback loop to rapidly equalise the output signal at terminal 135 with the output signals at the other terminals 133, 134 and 136. For example, if the delay provided by the RC delay circuit changes typically from 15.0 to 0.25 seconds, the feedback circuit is effectively short circuited until equalisation has again been achieved. If after the 10 seconds delay provided by the circuit 110 the four signals at the four output terminals 133 to 136 are brought back to equality by the feedback loops, the comparator 150 will no longer detect inequality and the trigger voltage will disappear. The switches 117, 117A, 117B will accordingly open and normal operation will resume.

If the output of one of the sensors exceeds the reference voltage by a predetermined amount, for example by a hand being placed directly over one of the sensors with a view to holding the lift door open, then the clamping circuit defined by the two zener diodes 131 and 132 comes into operation and further adjustment of the sensor signal by the feedback loop will be inhibited until the output signal from the sensor resumes a more normal level.

It will of course be appreciated that the error correction system described acts to automatically balance the outputs of the four sensors at all times. The rate of balancing is normally relatively slow but when a signal representative of a selected condition to be detected is sensed and sustained for a predetermined period of time, then the system will switch to a mode of operation in which the rate of balancing is relatively fast. As soon as the balance is achieved by the system reverts to its relatively slow balancing mode.

It will of course be appreciated that the trigger signal $V_T$ is also used to trigger the opening or re-opening of the lift door since there will only be an imbalance of signals on terminals 133 to 136 when an irregular object such as the human form is detected in the door opening.

It will also be appreciated that the circuitry can be equally adapted to respond to digital or analog signs. In the digital form, the signals from the four sensors are multiplexed and the comparators operate in an on/off mode.

In a modification, instead of the switch 117 being used to vary the resistance of the resistive part of the integrator defined by the resistors 122 and 123 and the capacitor 126 it can be used to modify the capacitance or both to achieve the necessary change in time constant.

Of course, while the error correction system has been described in conjunction with a lift door detection system, it has application in many other fields such as robotics as will be apparent to the person skilled in the art.

We claim:

1. An error compensation system comprising:
   an input terminal;
   an output terminal;
   a signal modifying circuit connecting said input terminal to said output terminal, said signal modifying circuit having a control input;
   reference signal producing means;
   comparison means having two inputs and one output, one input being connected to the output terminal and the other input being connected to said reference signal producing means for comparing the signal at the output terminal with the reference signal produced by the reference signal producing means and producing an error signal at said output;
   a first delay circuit having an input and an output;
   a second delay circuit having an input and an output, said second delay circuit having a substantially different time constant to the first delay circuit;
   means connecting the output of each delay circuit to the control input of the signal modifying circuit; and
   switch means connected to the output of the comparator and selectively connectable to the two inputs of the delay circuits, and having a control input responsive to a control signal to switch the output of the comparator to a selected one of the two delay circuits; and
   means for monitoring a parameter of the signal fed to the output terminal and producing said control signal in response thereto, said control signal causing said switch means to switch when said parameter complies with a predetermined condition.

2. A system according to claim 1 wherein said predetermined condition comprises a predetermined threshold level and wherein said monitoring means comprises a threshold circuit.

3. A system according to claim 1 or claim 2 wherein each said delay means comprises an integrating circuit.

4. An error compensation system comprising first and second terminals, a comparator having two inputs respectively connected to the first and second terminals and having an output, an integrator comprising resistance means and capacitance means connected to the output of the comparator, control means responsive to a predetermined trigger signal to alter the value of at least one of said resistance and capacitance means to change the time constant of the integrator, and modifying means for receiving an input signal and supplying it to the first terminal, the modifying means being responsive to the output of the integrator to modify the input signal in a sense to maintain the signal at the first terminal substantially constant.

5. A system according to claim 4 wherein said control means comprises a switch operable for changing the value of the resistance means.

6. A system according to claim 4 or to claim 5 including clamping means for clamping the output of the integrator to a predetermined value when the output of the integrator reaches a predetermined level.

7. A system according to claim 6 further comprising reference means for generating a reference signal at an output terminal thereof, and wherein the clamping means comprises a pair of zener diodes connected in series opposition between the output of the integrator and the output of the reference means.

8. A signal compensation system comprising:
   first and second sensors each providing an output in response to a monitored condition;
   first means connected to the output of the first sensor to provide a reference signal;
   second means connected to the output of the second sensor for modifying the output of the second sensor;
   a comparator connected to the first means and the second means for comparing the modified output of the second sensor with the reference signal to produce an error signal;
   feedback means connected to the output of the comparator and the second means and responsive to the error signal to modify the output of the second sensor in a sense to equalise it with the reference signal;
   a first time delay circuit having a first time constant connected in the feedback circuit to delay the error signal in the feedback circuit, a second delay circuit in the feedback circuit, the second delay circuit having a second time constant less than that of the first time constant and actuable to delay the error signal in the feedback circuit to a lesser extent than that caused by the first delay circuit; and
   trigger means coupled to the second delay circuit and responsive to a predetermined signal, to actuate said second delay circuit.

9. A system according to claim 8 wherein said predetermined signal comprises a predetermined difference in amplitude for a predetermined period of time between the quasi reference signal and the modified output of the second sensor.

10. A system according to claim 8 or claim 9 including clamping means for clamping the error signal in the feedback circuit at a predetermined level when the error signals reaches a predetermined magnitude.

11. A system according to claim 8 further comprising at least one further sensor providing an output in response to a monitored condition, and for each said further sensor:

third means connected to the output of the further sensor for modifying the output of the further sensor and;

a comparator connected to the first means and the third means for comparing the output of said third means with the reference signal to produce an error signal;

feedback means connected to the output of the comparator and the third means and responsive to the error signal to modify the output of the said further sensor in a sense to equalise it with the reference signal;

a first time delay circuit in the feedback means having a first time constant connected to delay the error signal in the feedback means;

a second delay circuit in the feedback means having a second time constant less than the first time constant actuable to delay the error signal in the feedback means to a lesser extent than the delay produced by the first delay circuit.

12. A system according to claim 8 wherein the trigger means comprises comparison means for comparing the reference signal with the modified output of the second sensor and providing an output to actuate the delay circuit when a difference is detected lasting in excess of a predetermined duration.

* * * * *

UNITED STATES PATENT AND TRADEMARK OFFICE
CERTIFICATE OF CORRECTION

PATENT NO. : 4,839,605
DATED : June 13, 1989
INVENTOR(S) : J. Trett; P.F. Bradbeer It is certified that error appears in the above-identified patent and that said Letters Patent is hereby corrected as shown below:

Column 1, line 32, change "sensors" to -- sensor --.
Column 1, line 33, change "age" to -- ages --.

Column 2, line 33, after "variations" insert a period.
Column 2, line 38, change "has" to -- as --.

Column 4, line 14, change "asymetrical" to -- asymmetrical --.
Column 4, line 40, change "is of" to -- if --.

Column 5, line 6, after "achieved" delete "by".

In the Claims

Column 5, line 65, before "claim" (second occurrence) insert --to--.

Column 6, line 59, before "reference" delete "quasi".

Column 7, line 6, before "said" insert -- the --.

Signed and Sealed this

Nineteenth Day of February, 1991

Attest:

HARRY F. MANBECK, JR.

*Attesting Officer*        *Commissioner of Patents and Trademarks*